United States Patent
Wiesbauer et al.

(10) Patent No.: US 8,134,396 B2
(45) Date of Patent: Mar. 13, 2012

(54) DYNAMIC ELEMENT MATCHING FOR DELAY LINES

(75) Inventors: Andreas Wiesbauer, Portschach (AT); Luis Hernandez, Madrid (ES); Dietmar Straeussnigg, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/392,046

(22) Filed: Feb. 24, 2009

(65) Prior Publication Data

US 2010/0213999 A1  Aug. 26, 2010

(51) Int. Cl.
*H03H 11/26* (2006.01)
(52) U.S. Cl. .................................................. 327/271
(58) Field of Classification Search .................. None
See application file for complete search history.

(56) References Cited

U.S. PATENT DOCUMENTS

| | | | |
|---|---|---|---|
| 5,521,599 A * | 5/1996 | McCarroll et al. | 341/122 |
| 5,646,568 A * | 7/1997 | Sato | 327/276 |
| 6,868,047 B2 * | 3/2005 | Sartschev et al. | 368/118 |
| 7,397,292 B1 * | 7/2008 | Potanin | 327/261 |
| 7,535,393 B1 * | 5/2009 | Straussnigg et al. | 341/143 |
| 7,746,256 B2 * | 6/2010 | Wiesbauer et al. | 341/143 |
| 2006/0066368 A1 * | 3/2006 | Gabato et al. | 327/158 |
| 2008/0046771 A1 * | 2/2008 | Hsu | 713/401 |

OTHER PUBLICATIONS

Daniels et al., "A/D Conversion using an Asynchronous Delta-Sigma Modulator and a Time-to-Digital Converter", Univ Carlos III, IEEE Xplore, 2008, pp. 1648-1651.
Roza, "Poly-Phase Sigma-Delta Modulation", IEEE Transactions on Circuits and Systems—II: Analog and Digital Signal Processing, vol. 44, No. 11, Nov. 1997, pp. 915-923.

* cited by examiner

*Primary Examiner* — Lincoln Donovan
*Assistant Examiner* — Sibin Chen
(74) *Attorney, Agent, or Firm* — SpryIP, LLC

(57) ABSTRACT

This disclosure relates to dynamic element matching in delay line circuits to reduce linearity degradation and delay line mismatching.

19 Claims, 6 Drawing Sheets

DYNAMIC ELEMENT MATCHING FOR DELAY LINES

BACKGROUND

This application relates to reducing linearity degradation in delay lines and, more particularly, to dynamic element matching of delay line components.

A Time to Digital converter (TDC) is used for converting a signal of sporadic pulses into a digital representation of their time indices. In other words, a TDC is used to output the time of arrival for each incoming pulse. Because the magnitudes of the pulses are not usually measured, a TDC is used when the important information is to be found in the timing of events. The performance of the TDC depends on the accuracy of a delay of delay elements in the TDC. In practice, the variations of the delay elements are quite high due to process deviations and temperature variations resulting in system performance degradations.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items.

DETAILED DESCRIPTION

Disclosed herein are techniques for providing dynamic element matching (DEM) for delay lines. The order of delay elements (or coupling points) fed the reference clock ($\phi$) are modified dynamically to optimize performance. DEM for delay lines saves circuit layout area because the matching requirements to the building blocks used to construct the circuit can be relaxed. Further using DEM minimizes the error of the overall delay of the delay lines as an error in a single building block can be eliminated. In addition, improved linearity of the delay lines can be achieved.

The system includes a filter to receive and filter a target signal, a threshold detector to provide an indication signal when the filtered target signal exceeds a threshold voltage. The system also includes a multiple output delay circuit. The multiple output delay circuit includes a delay line circuit including delay line elements. The delay line circuit receives a clock signal and generates delayed clock signals. An interchange circuit dynamically interchanges the delay line elements to minimize an effect of the delay variations of the delayed line elements on the delayed clock signals. A sample and hold circuit receives and samples the indication signal using the delayed clock signal and generates an output signal. A demodulator demodulates the output signal.

In one implementation, a system is shown that includes an analog to digital converter. In the system, a device is included having a delay circuit with a plurality of delay line elements. The delay circuit receives a clock signal. The delay line elements have delay variations and generate delayed clock signals. An interchange circuit is included to dynamically rearrange the delay line elements to minimize an effect of the delay variations on the delayed clock signals. A sample and hold (S/H) circuit receives a target signal and the delayed clock signals. The S/H circuit samples and holds a received target signal using the delayed clock signals. Further the S/H circuit generates an output signal by sampling the target signal with the delayed clock signals.

In another described implementation, a method is shown that generates a clock signal and feeds the clock signal through a delay line circuit having delay line elements with delay variations. Delayed clock signals are generated with the delay line elements. The delay line elements are dynamically interchanged to minimize the effect of the delay variations on the delayed clock signals.

The techniques described herein may be implemented in a number of ways. One example environment and context is provided below with reference to the included figures and ongoing discussion.

Exemplary Systems and Operation

Figure 1:
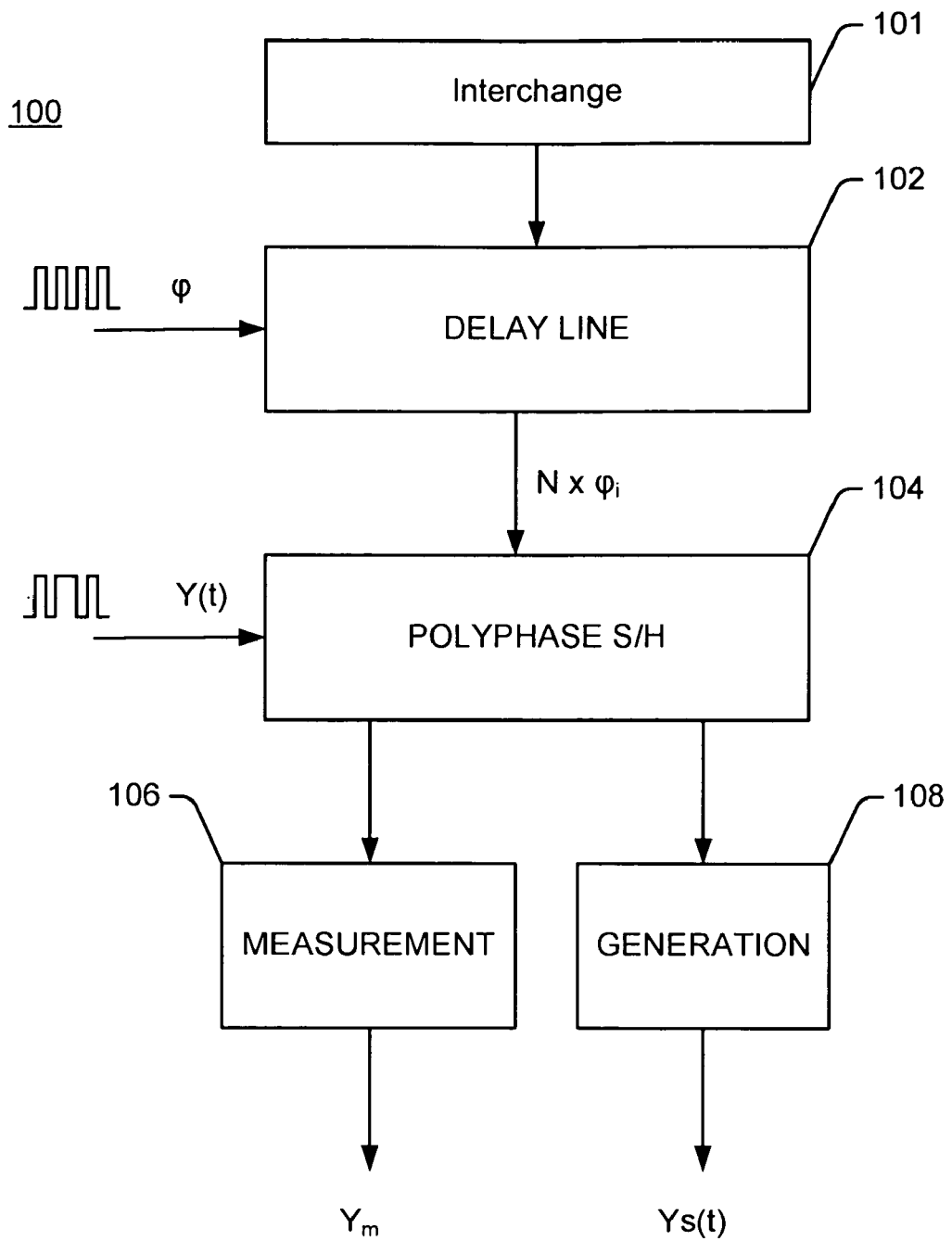
FIG. 1 is simplified schematic diagram for a time to digital converter (TDC) that generates a measurement signal (Ym) and a generation signal Ys(t) from an input signal using poly-phases of a reference clock ($\phi$) by interchanging delay elements in accordance with the invention.

An exemplary TDC system 100 is shown in FIG. 1. TDC system 100 includes an interchange circuit 101 connected to delay line circuit 102. Delay circuit 102 is connected via a poly-phase signal and hold (S/H) circuit 104 to a measurement circuit 106 and a generation circuit 108. A clock $\phi$ is fed to the delay line circuit 102, which generates poly-phases of the clock $\phi$ for poly-phase S/H circuit 104.

Delay line circuit 102 includes a number of delay elements (not shown) with a predetermined delay (T). The number (N) of delay elements determines the number of poly-phases supplied to poly-phase S/H circuit 104. The delay T is chosen such that N times T is equal to the cycle duration of the clock $\phi$. The order of the elements in the delay line circuit 102 is controlled by interchange circuit 101. Further details of the delay line circuit 102 are explained in connection with FIG. 2.

Input signal y(t) is supplied to poly-phase S/H circuit 104. At each poly-phase (designated as $\phi_i$), input signal y(t) is sampled by the poly-phase S/H circuit 104, so that the signal y(t) effectively is sampled N times higher than the frequency of the clock $\phi$. One signal from the output of poly-phase S/H circuit 104 is fed through measurement circuit 106 to generate a measurement signal Ym. Another signal from the output of poly-phase S/H circuit 104 is fed through generation circuit 108 to generate a delayed input signal Ys(t).

Figure 2:
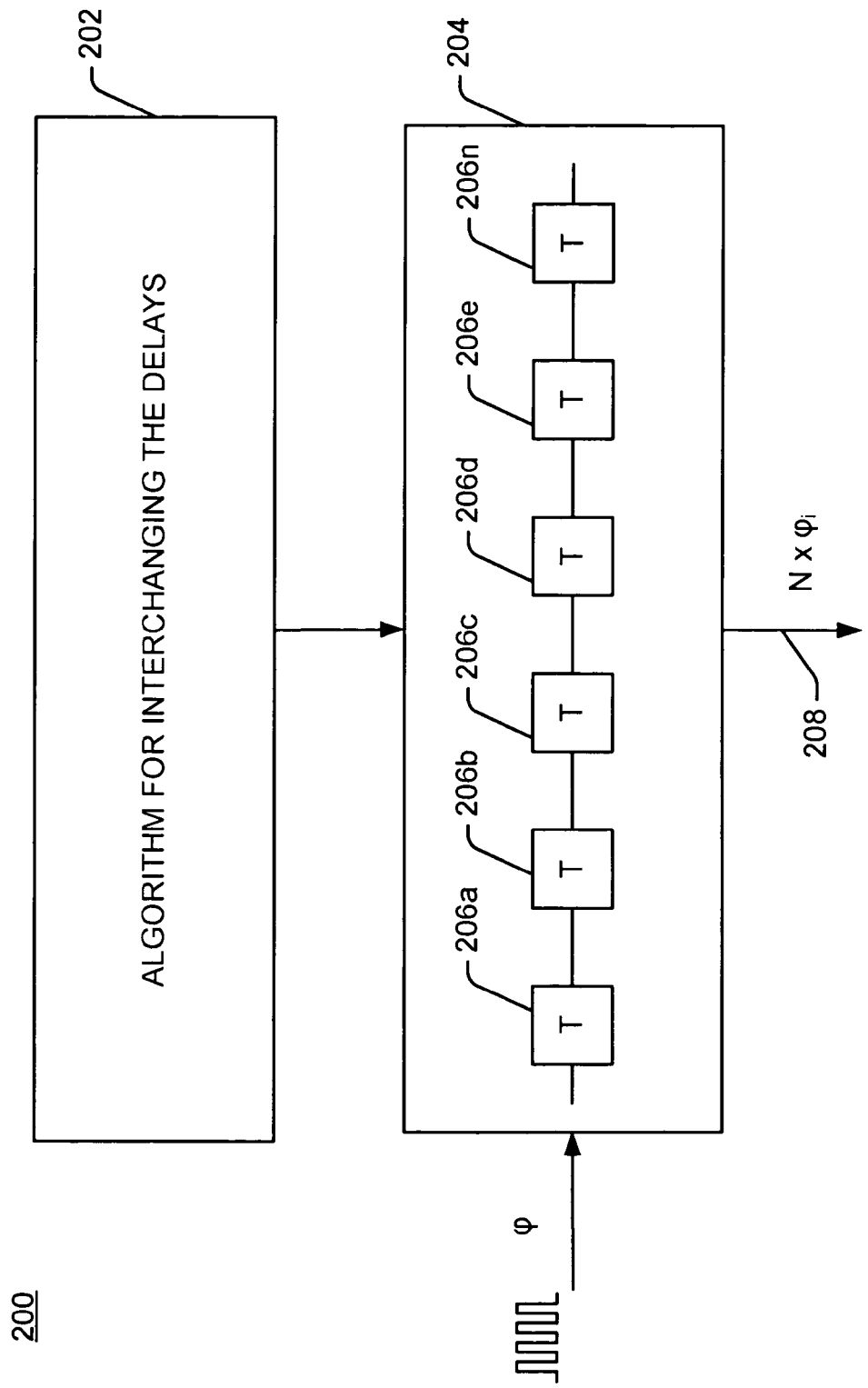
FIG. 2 is a simplified block diagram of a system for generating poly-phases of a clock ($\phi$) by interchanging the delay elements to provide dynamic element matching for delay lines.

FIG. 2 illustrates a simplified block diagram of a system 200 for generating poly-phases of a clock. System 200 includes interchange circuit 202 coupled with delay circuit 204. Delay circuit 204 includes delay elements 206a-206n each having a predetermined delay T. Delay circuit 204 receives a clock signal ϕ, which is fed to delay elements 206a-206n. Delay circuit 204 uses delay elements 206a-206n to generate one or more poly-phase clock signals (N×ϕ$_i$) that are fed to line 208. In one implementation, delay elements 206a-206n are connected in series. The number (N) of delay elements 206a-206n determines the number (N) of poly-phase clock signals. The order of the delay elements 206a-206n are controlled by interchange circuit 202. Generally any kind of algorithm for rearranging or interchanging the delay line elements 206a-206n can be incorporated in interchange circuit 202 and applied to delay circuit 204. Examples of systems incorporating the dynamic selection of delay elements are shown in FIGS. 3-5.

Figure 3:
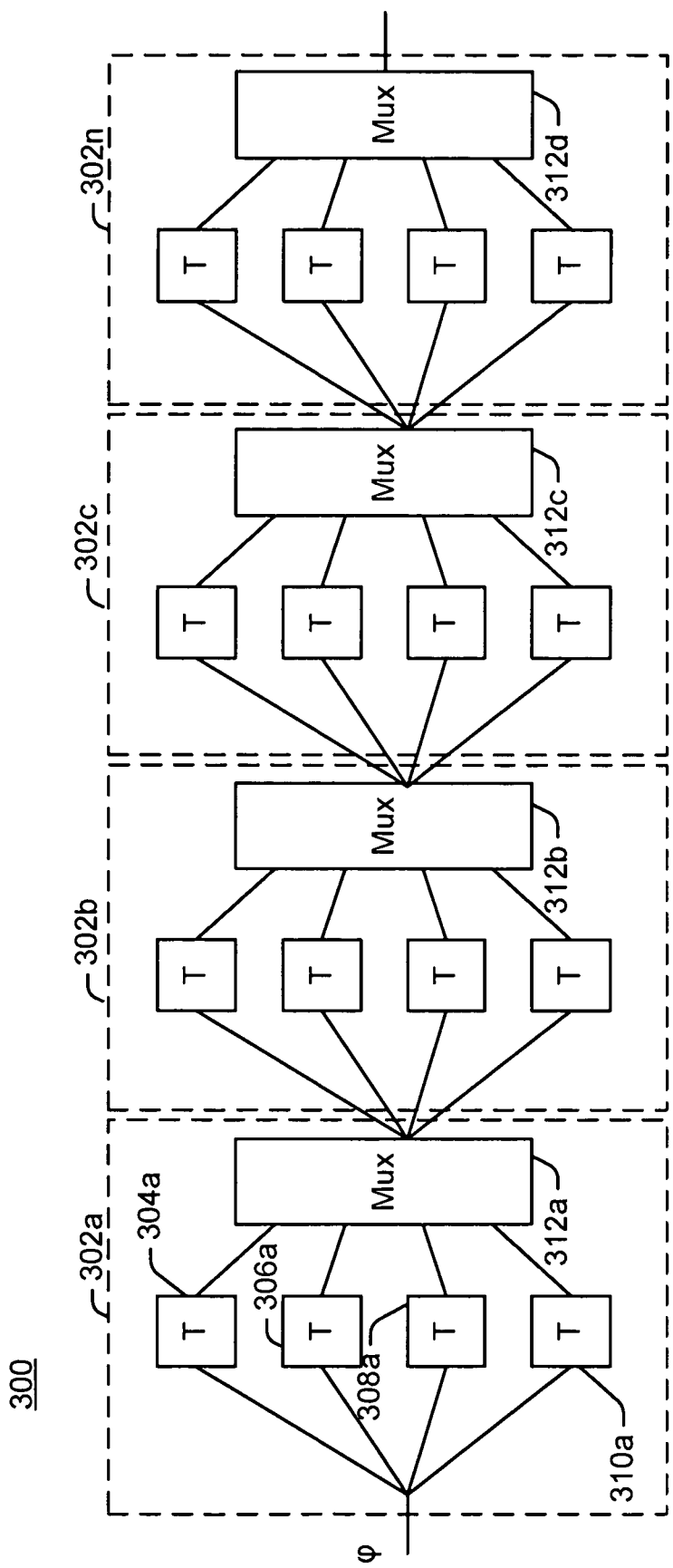
FIG. 3 is a simplified schematic diagram of one implementation of a circuit shown in FIG. 2 for interchanging delay elements using multiplexer blocks to provide dynamic element matching for delay lines.

FIG. 3 is a simplified schematic diagram of one implementation of a system 300 for interchanging delay elements. System 300 includes multiplexer blocks 302a-302n that are connected in series to provide dynamic element matching for delay lines. Multiplexer blocks 302a-302n are substantially identical and thus the details of multiplexer block 302a will be described in detail. Although only four blocks 302a-302n are shown, any number of multiplexer blocks may be used in system 300.

Multiplexer block 302a includes parallel connected delay elements 304a-310a having a common input and have an output connected to different terminals of multiplexer 312a. Delay elements 306a-306n each having a predetermined delay T. Delay module 302a receives a clock signal ϕ, which is fed via delay elements 304a-310n to multiplexer 312a. Each of the multiplexers 312a-312d is controlled by an interchange circuit, such as interchange circuit 202 (FIG. 2). Interchange circuit selects which signal on a multiplexer's input terminal, such as multiplexer 312a, is to be provided to the multiplexer's output terminal. The signal on the multiplexer's output terminal, such as multiplexer 312a, is fed to an input terminal on an adjacent connected multiplexer block, such as block 302b. Further the signal on the multiplexer's output terminal may be fed to a poly-phase signal and hold circuit, such as circuit 104 (See FIG. 1).

Figure 4:
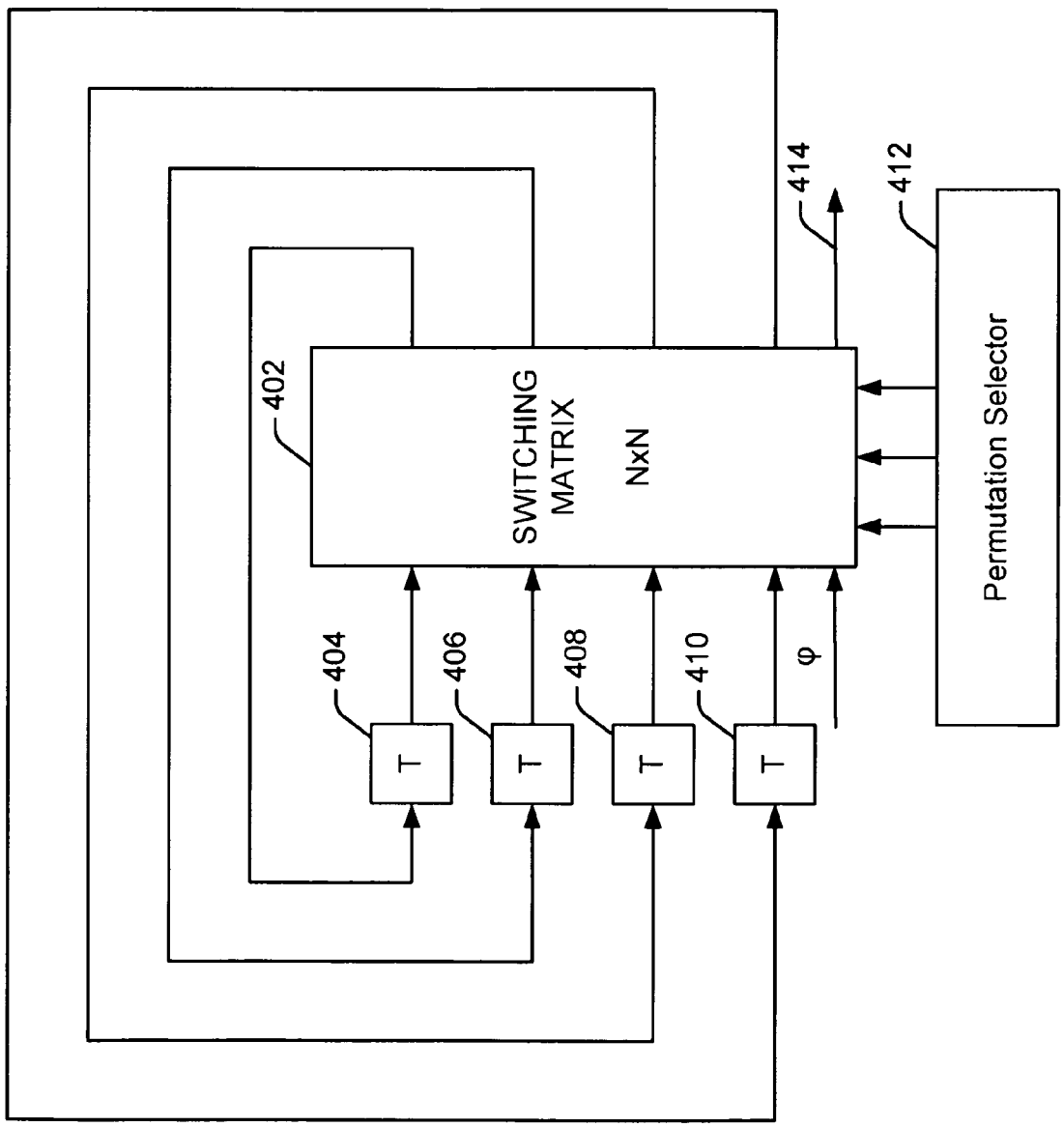
FIG. 4 is a simplified schematic diagram of another implementation of a circuit shown in FIG. 2 for interchanging delay elements using a permutation matrix to provide dynamic element matching for delay lines.
Figure 5:
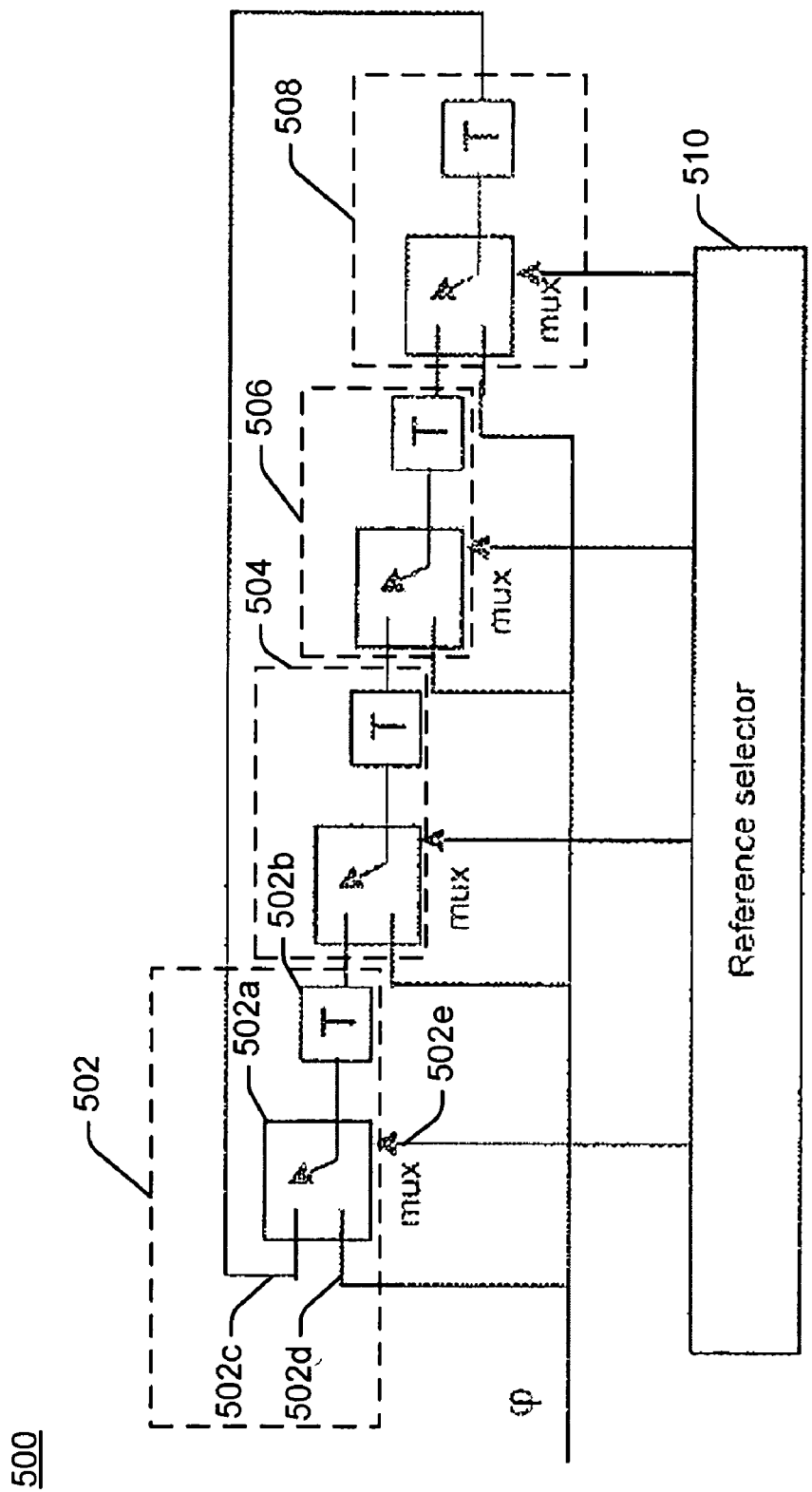
FIG. 5 is a simplified schematic diagram of a further implementation of a circuit shown in FIG. 2 for interchanging delay elements using ring delay elements to provide dynamic element matching for delay lines.

FIG. 4 is a simplified schematic diagram of another implementation of a system 400 to interchange delay elements using a permutation matrix. System 400 includes N×N switching matrix 402 having input terminals and output terminals (such as output terminal 414). Connected to input terminals of switching matrix 402 are the outputs of delay elements 404-410. Delay elements 404-410 each having a predetermined delay T. Switching matrix 402 is connected on its output terminals to the input terminals of delay elements 404-410. Switching matrix 402 is fed clock signal ϕ on one of its input terminals. The signal on output terminal 414 may be fed to a poly-phase signal and hold circuit; such as circuit 104 (See FIG. 1).

In one implementation, switching matrix 402 is connected to permutation selector 412 (or an interchange selector) that selects which input of switching matrix 402 is to be connected to which input of delay elements 404-410. Permutation selector 414 also selects which input of switching matrix is to be connected to output terminal 414.

FIG. 5 is a simplified schematic diagram of another implementation of a circuit 500 for interchanging delay elements to provide dynamic element matching for delay lines. Circuit 500 includes ring delay line modules 502-508 connected to reference selector 510 and a line that is fed clock signal ϕ. The ring delay line modules 502-508 are connected in series with the other ring delay line modules 502-508 and have an input terminal and an output terminal. The output terminal of the ring delay line modules 502-508 are connected in series to an input terminal of the next of the ring delay line modules. The last ring delay line module 508 has an output terminal connected to the input terminal of the first ring delay line module 502. Although four ring delay line modules 502-508 are shown, the embodiment is not limited to four modules, and any number of ring delay line modules may be used.

Ring delay line modules 502-508 are identical, thus only ring delay line module 502 will be described. Ring delay line module 502 includes switch 502a, with an output terminal connected to a delay element 502b. Delay element 502b includes input terminals 502c, 502d and 502e. Input terminal 502c is connected to the output terminal of a delay element in an adjacent delay line module, such as module 508. Input terminal 502d is connected to a line that is fed the clock signal ϕ. Input terminal 502e is connected to reference selector 510. Delay element 502b has a delay time of T. In one implementation, the time T has a predetermined value such that the number of ring delay line modules (N) times T is less than the time of a period of clock signal ϕ.

Reference selector 510 is connected to delay line modules 502-508. Reference selector 510 selects whether line modules 502-508 are fed clock signal ϕ via a delay line element to the line module's output terminal or fed the output signal from an adjacent line module to the line module's output terminal. The reference selector selects the right module based on the history and ensures that all the delay elements are used equally often on average. In other words, the mismatch is set to zero on average.

Figures 6A, 6B:
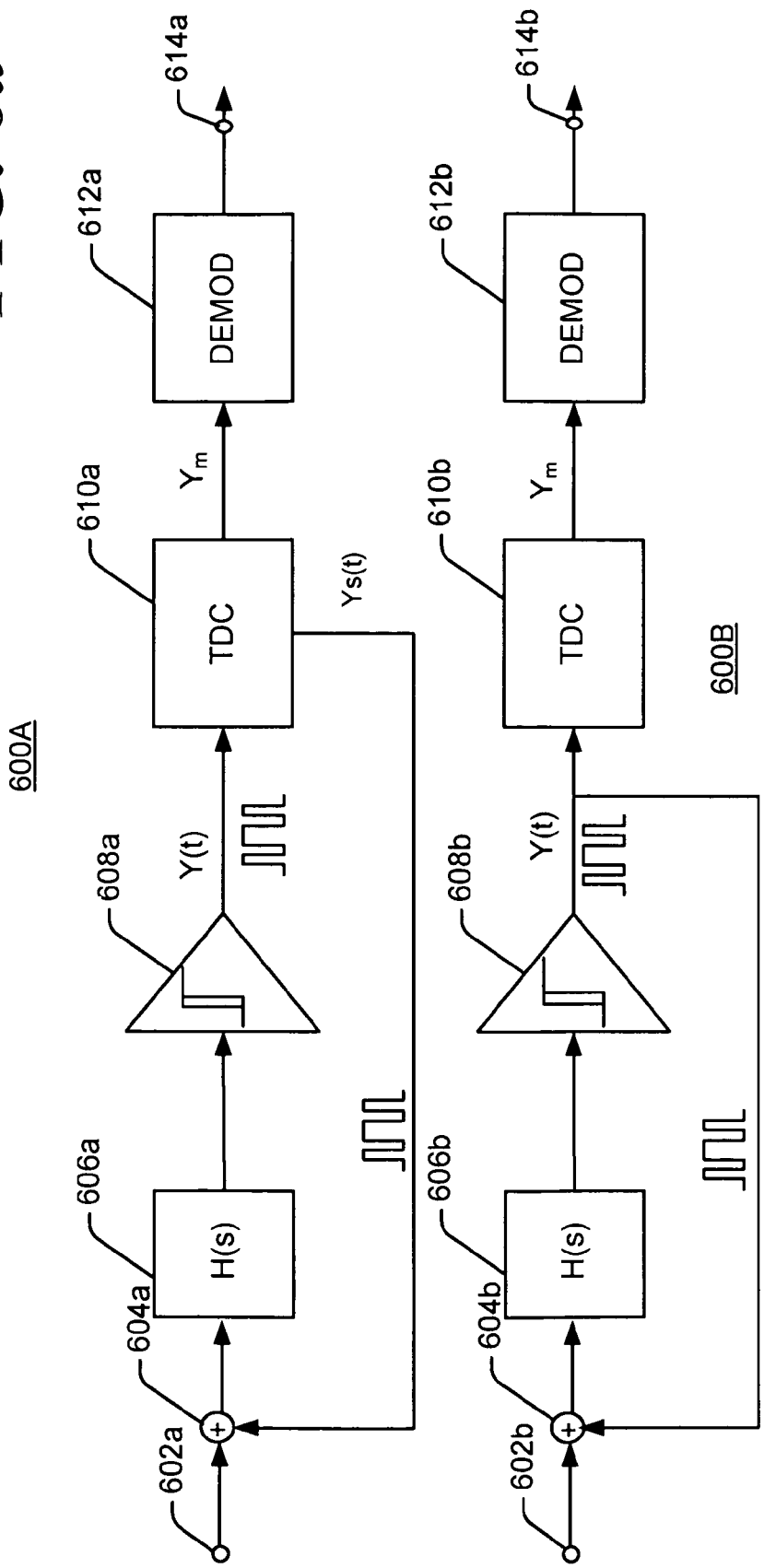
FIG. 6a is simplified schematic diagram of an exemplary implementation of a synchronous pulse width modulator with a two-output TDC that includes a poly-phase sampler circuit with dynamic element matching for delay lines.
FIG. 6b is simplified schematic diagram of an exemplary implementation of an asynchronous pulse width modulator with a one-output TDC that includes a poly-phase sampler circuit with dynamic element matching for delay lines.

FIG. 6a is simplified schematic diagram of an exemplary implementation of a synchronous pulse width modulator 600a. Pulse width modulator 600a includes an input terminal 602a connected through adder circuit 604a to filter 606a. The output terminal of filter is connected to detector 608a. An output terminal of detector 608a is connected to TDC 610a (also referred to as a multiple output delay circuit). One exemplary TDC is shown in FIG. 1, e.g. TDC 100, with two-outputs that include a poly-phase sampler circuit with dynamic element matching for delay lines. TDC 610a has a measurement output signal Ym that is fed via demodulator 612a to output terminal 614a and has an output signal Ys(t) that is fed to a negative terminal of adder 604a.

In operation of synchronous pulse width modulator 600a, a signal to be pulse width modulated is received on terminal 602a. The signal is combined using adder circuit 604a with the inverse of the output signal Ys(t) from TDC 610a. The combined signal is fed to filter 606a. Filter 606a then filters the combined signal and then feeds the filtered combined signal to detector 608a. Detector 608a generates an indication signal for TDC 610a when the level of the filtered combined signal exceeds a predetermined voltage level. TDC 610a generates a delayed indication signal Ys(t) for adder circuit 608a. TDC 610a also provides a measurement signal Ym that is demodulated by demodulator 612a and fed as a pulse width modulated signal to output terminal 614a. The delay elements in TDC 610a are arranged using the techniques previously described.

FIG. 6b is simplified schematic diagram of an exemplary implementation of an asynchronous pulse width modulator 600b. Pulse width modulator 600b includes an input terminal 602b connected through adder circuit 604b to filter 606b. The output terminal of filter 608b is connected to detector 608b. An output terminal of detector 608b is connected to TDC 610b and a negative terminal of adder circuit 604b. One exemplary TDC is shown in FIG. 1, e.g. TDC 100, and includes a poly-phase sampler circuit with dynamic element matching for delay lines. TDC 610*b* has a measurement output terminal that is coupled via demodulator 612*b* to output terminal 614*b*.

In operation of asynchronous pulse width modulator 600*b*, a signal to be pulse width modulated is received on terminal 602*b*. The received signal is combined with the inverse of the output signal Y(t) from detector 608*b* and fed to filter 606*b*. Filter 606*b* then filters the combined signal and then feeds the filtered combined signal to detector 608*b*. Detector 608*b* generates an indication signal for TDC 610*b* when the level of the combined filtered signal from filter 606*b* exceeds a predetermined voltage level. TDC 610*b* provides a measurement signal Ym that is demodulated by demodulator 612*b* and fed as a pulse width modulated signal to output terminal 614*b*. The delay elements in TDC 610*b* are arranged using the techniques previously described.

Conclusion

Although the subject matter has been described in language specific to structural features and/or methodological acts, it is to be understood that the subject matter defined in the appended claims is not necessarily limited to the specific features or acts described. Rather, the specific features and acts are disclosed as preferred forms of implementing the claims.

The invention claimed is:

1. A system comprising:
  a filter to receive and filter a target signal;
  a threshold detector to provide an indication signal when the filtered target signal exceeds a threshold voltage;
  a multiple output delay circuit comprising:
    a delay line circuit including a plurality of delay line modules, the delay line modules operable to receive a clock signal and including a delay line element, the delay line elements having delay variations and operable to generate delayed clock signals;
    an interchange circuit to dynamically interchange the delay line elements to minimize an effect of the delay variations on the delayed clock signals; and
    a sample and hold circuit to receive the indication signal and the delayed clock signals, to sample and hold the received indication signal using the delayed clock signals, and to generate an output signal by sampling the indication signal with the delayed clock signals.

2. A system as recited in claim 1, further comprising means for subtracting the indication signal from the target signal before the target signal is received by the filter.

3. A system as recited in claim 1, wherein the multiple output delay circuit is operable to generate a delayed indication signal; and wherein the system further comprises means for subtracting the delayed indication signal from the target signal before the target signal is received by the filter.

4. A system as recited in claim 1, wherein the delay line modules are connected in series, wherein each of the delay line modules includes a plurality of delay line elements.

5. A system as recited in claim 4, wherein each of the delay line modules includes a plurality of parallel connected delay line elements with outputs connected to a multiplexer operable to enable one of the parallel connected delay line elements and disable the other parallel connected delay line elements.

6. A system as recited in claim 1, wherein the delay line circuit includes the plurality of delay line elements coupled in parallel and having outputs connected to a switching matrix circuit, wherein the matrix circuit includes a plurality of outputs connected to inputs of the plurality of delay line elements, wherein the switching matrix circuit is controlled by a permutation selector; and wherein the permutation selector is operable to select which output of the plurality of delay line elements is connected to which output of the switching matrix circuit.

7. A system as recited in claim 1, wherein the plurality of delay line modules are connected in series, wherein each of the delay line modules includes a plurality of input terminals and an output terminal, wherein one of the input terminals of one of the plurality of delay line modules is connected to the output terminal of one of the other delay line modules, wherein each of the delay line modules comprises a switch connected via one of the plurality of delay line elements to the output terminal, wherein the switch includes a first terminal connected to one of the input terminals of the delay line modules and a second terminal operable to receive the clock, and wherein the system further comprises a reference selector for selecting one of the switches to control whether the first terminal is connected to the one of the plurality of delay line elements or whether the second terminal is connected to the one of the plurality of delay line elements.

8. In a system comprising an analog to digital converter, a device comprising:
  a delay circuit including a plurality of delay line elements, the delay circuit being operable to receive a clock signal, the delay line elements having delay variations and operable to generate delayed clock signals;
  an interchange circuit to dynamically rearrange the delay line elements to minimize an effect of the delay variations on the delayed clock signals; and
  a sample and hold circuit to receive a target signal and the delayed clock signals, to sample and hold a received target signal using the delayed clock signals, and to generate an output signal by sampling the target signal with the delayed clock signals.

9. A device as recited in claim 8, further comprising an input module including a filter coupled to a level detector, the input module operative to receive an input signal and generate the target signal, and a subtraction circuit to subtract the output signal from the target signal before the output signal is fed to the filter.

10. A device as recited in claim 8, further comprising an input module operable to receive an input signal and generate the target signal, wherein the sample and hold circuit is operable to generate a delayed indication signal, and wherein the system further comprises a subtraction circuit to subtract the delayed indication signal from the target signal before the target signal is received by the input module.

11. A device as recited in claim 10, wherein the delay line circuit includes the plurality of delay line elements coupled in parallel and has outputs connected to a switching matrix circuit, wherein the matrix circuit includes a plurality of outputs connected to inputs of the plurality of delay line elements, wherein the switching matrix circuit is controlled by a permutation selector; and wherein the permutation selector is operable to select which output of the plurality of delay line elements is connected to which output of the switching matrix circuit.

12. A device as recited in claim 8, wherein the plurality of delay line elements are connected to each other in series.

13. A device as recited in claim 8, wherein the delay circuit includes a plurality of parallel connected delay line elements with outputs connected to a multiplexer operable to select one of the parallel connected delay line elements.

14. A method comprising:
  feeding a clock signal through a delay line circuit having a plurality of delay line elements with delay variations;
  generating a plurality of delayed clock signals with the delay line elements;

dynamically interchanging the delay line elements to minimize the effect of the delay variations on the delayed clock signals; and generating a pulse width modulated signal with a sample and hold circuit using a target signal to be sampled and the delayed clock signals from the interchanged delay line elements.

15. The method as recited in claim 14, further comprising feeding the signal to be sampled to a sample and hold circuit and feeding delayed clock signals from the interchanged delay line elements to the sample and hold circuit.

16. The method as recited in claim 14, further comprising subtracting the pulse width modulated signal from the target signal before the target signal is received by the filter.

17. The method as recited in claim 14 further comprising connecting the plurality of delay line elements in series.

18. The method as recited in claim 17, further comprising: connecting the plurality of delay line elements to a multiplexer; and selecting one of the delay line elements using the multiplexer.

19. A method as recited in claim 14, further comprising:
coupling the delay line elements together in parallel;
connecting outputs of the delay line elements to a switching matrix circuit;
connecting a plurality of outputs of the matrix circuit to inputs of the plurality of delay line elements;
controlling the switching matrix circuit with a permutation selector; and
selecting using the permutation selector which output of the plurality of delay line elements is connected to which output of the switching matrix circuit.

* * * * *